US009625555B2

(12) United States Patent
Ryu et al.

(10) Patent No.: US 9,625,555 B2
(45) Date of Patent: Apr. 18, 2017

(54) APPARATUS, METHOD, AND MAGNETIC RESONANCE IMAGING SYSTEM FOR SHIMMING B1 MAGNETIC FIELD USING RF TRANSCEIVER COIL AND RF RECEIVER COIL

(71) Applicant: Samsung Electronics Co., Ltd., Suwon-si (KR)

(72) Inventors: Yeun-chul Ryu, Hwaseong-si (KR); Young-beom Kim, Yongin-si (KR); Seong-deok Lee, Seongnam-si (KR); Jae-mock Yi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 788 days.

(21) Appl. No.: 13/972,038

(22) Filed: Aug. 21, 2013

(65) Prior Publication Data
US 2014/0232392 A1 Aug. 21, 2014

(30) Foreign Application Priority Data

Feb. 19, 2013 (KR) .................. 10-2013-0017660

(51) Int. Cl.
*G01R 33/58* (2006.01)
*G01R 33/565* (2006.01)
*G01R 33/3875* (2006.01)

(52) U.S. Cl.
CPC ....... *G01R 33/583* (2013.01); *G01R 33/5659* (2013.01); *G01R 33/3875* (2013.01)

(58) Field of Classification Search
CPC .............. G01R 33/583; G01R 33/5659; G01R 33/3875; A61B 5/055
See application file for complete search history.

(56) References Cited

U.S. PATENT DOCUMENTS

| 7,403,004 B2 | 7/2008 | Morich et al. |
| 7,701,213 B2 | 4/2010 | Graesslin et al. |
| 2005/0062472 A1* | 3/2005 | Bottomley ......... G01R 33/3415 324/317 |

(Continued)

FOREIGN PATENT DOCUMENTS

| JP | 2010-029640 A | 2/2010 |
| JP | 2011-056087 A | 3/2011 |
| JP | 2011-152348 A | 8/2011 |

OTHER PUBLICATIONS

Metzger et al., Local B1+ shimming for prostate imaging with transceiver arrays at 7T based on subject-dependent transmit phase measurements, [Online] Jan. 28, 2008, Magnetic Resonance in Medicine vol. 59 Issue 2, [Retrieved from the Internet] < http://onlinelibrary.wiley.com/doi/10.1002/mrm.21476/epdf> pp. 396-409.*

*Primary Examiner* — David Gray
*Assistant Examiner* — Laura Roth
(74) *Attorney, Agent, or Firm* — NSIP Law (57) ABSTRACT

A method of shimming a magnetic field, includes applying radio frequency (RF) signals to an object, using a transceiver coil, and calibrating phase offsets of magnetic resonance signals acquired from the object through a receiver coil. The method further includes generating RF signals to be applied through the transceiver coil based on magnetic resonance signals acquired from the object through the transceiver coil and the calibrated magnetic resonance signals.

16 Claims, 5 Drawing Sheets

(56) References Cited

U.S. PATENT DOCUMENTS

| | | | | |
|---|---|---|---|---|
| 2009/0096450 A1* | 4/2009 | Roland | ............ | A61B 5/015 |
| | | | | 324/315 |
| 2012/0268132 A1* | 10/2012 | Zhu | ............ | G01R 33/34 |
| | | | | 324/322 |
| 2013/0251227 A1* | 9/2013 | Wang | ............ | G01R 35/00 |
| | | | | 382/131 |

* cited by examiner

APPARATUS, METHOD, AND MAGNETIC RESONANCE IMAGING SYSTEM FOR SHIMMING B1 MAGNETIC FIELD USING RF TRANSCEIVER COIL AND RF RECEIVER COIL

CROSS-REFERENCE TO RELATED APPLICATIONS

This application claims the benefit under 35 USC 119(a) of Korean Patent Application No. 10-2013-0017660, filed on Feb. 19, 2013, in the Korean Intellectual Property Office, the entire disclosure of which is incorporated herein by reference for all purposes.

BACKGROUND

1. Field

The present disclosure relates to an apparatus, a method, and a magnetic resonance imaging system for shimming a B1 magnetic field, using a radio frequency (RF) transceiver coil and a RF receiver coil.

2. Description of the Related Art

A magnetic resonance imaging (MRI) apparatus that is a medical device using magnetic resonance (hereinafter referred to as MR) is a representative image diagnosis device whose significance has gradually increased. As a representative method of acquiring an MR image having a high definition and a high image quality, a multi-channel radio frequency (RF) transmitter system has been studied. The multi-channel RF transmitter system constitutes an RF antenna transmitting an independent RF signal via channels.

The multi-channel RF transmitter system is designed so that a multi-channel RF transmission coil effectively contributes to an uniformization of a B1 magnetic field. Also, energy of the B1 magnetic field generated by the multi-channel RF transmission coil is not absorbed by the human body.

SUMMARY

In one general aspect, a method of shimming a magnetic field, includes applying radio frequency (RF) signals to an object, using a transceiver coil, and calibrating phase offsets of magnetic resonance signals acquired from the object through a receiver coil. The method further includes generating RF signals to be applied through the transceiver coil based on magnetic resonance signals acquired from the object through the transceiver coil and the calibrated magnetic resonance signals.

In another general aspect, an apparatus configured to shim a magnetic field, includes a transceiver coil configured to apply RF signals to an object, and acquire magnetic resonance signals from the object, and a receiver coil configured to acquire magnetic resonance signals from the object. The apparatus further includes a phase calibrator configured to calibrate phase offsets of the magnetic resonance signals acquired through the receiver coil, and an RF coil driver configured to generate RF signals to be applied through the transceiver coil based on the magnetic resonance signals acquired through the transceiver coil and the calibrated magnetic resonance signals.

Other features and aspects will be apparent from the following detailed description, the drawings, and the claims.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 1:
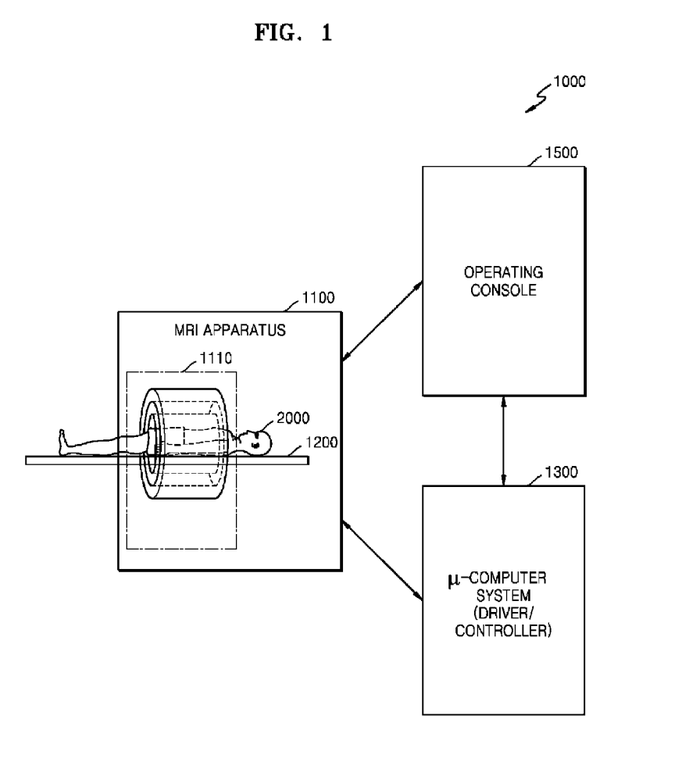
FIG. 1 is a diagram illustrating an example of a magnetic resonance imaging (MRI) system.

FIG. 1 is a diagram illustrating an example of a magnetic resonance imaging (MRI) system 1000. Referring to FIG. 1, the MRI system 1000 includes an MRI apparatus 1100, a microcomputer system 1300, and an operating console 1500. The microcomputer system 1300 (or p-computer system) includes a driver or controller that drives and controls the MRI apparatus 1100. Differently from shown in FIG. 1, elements constituting the MRI system 1000 may not be physically separated from one another, but some of the elements may be combined with one another.

The MRI apparatus 1100 receives, from the operating console 1500 directly or via the microcomputer system 1300, a control signal to generate a magnetic resonance (MR) image, and operates based on the control signal. The MRI apparatus 1100 also acquires a MR signal from a scan of a subject 2000 on a bed 1200 of a magnet system 1110. The MR signal is used to generate the MR image. The MRI apparatus 1100 transmits the MR signal to the microcomputer system 1300.

The microcomputer system 1300 receives the MR signal from the MRI apparatus 1100, reorganizes the MR signal to generate an MR image of a predetermined area of the subject 2000, and transmits the MR image to the operating console 1500. The microcomputer system 1300 may include an image processor (not shown), a storage (not shown), and an interface (not shown). The image processor reorganizes an image signal generated from the MR signal, or generates the MR signal to process the image signal. The storage stores the image signal and the MR image. The interface connects the MRI apparatus 1100 to the operating console 1500.

The operating console 1500 may include a monitor (not shown), various types of input devices (not shown), such as, for example, a keyboard and a mouse, and a panel (not shown). The monitor receives the MR image from the microcomputer system 1300, and displays the MR image. The various types of input devices receive control information from a user, and the panel shows a scan condition and a scan situation.

The MRI system 1000 may include a hybrid MRI system connected to other medical imaging apparatuses, such as, for example, a Position Emission Tomography (PET) apparatus.

Figure 2:
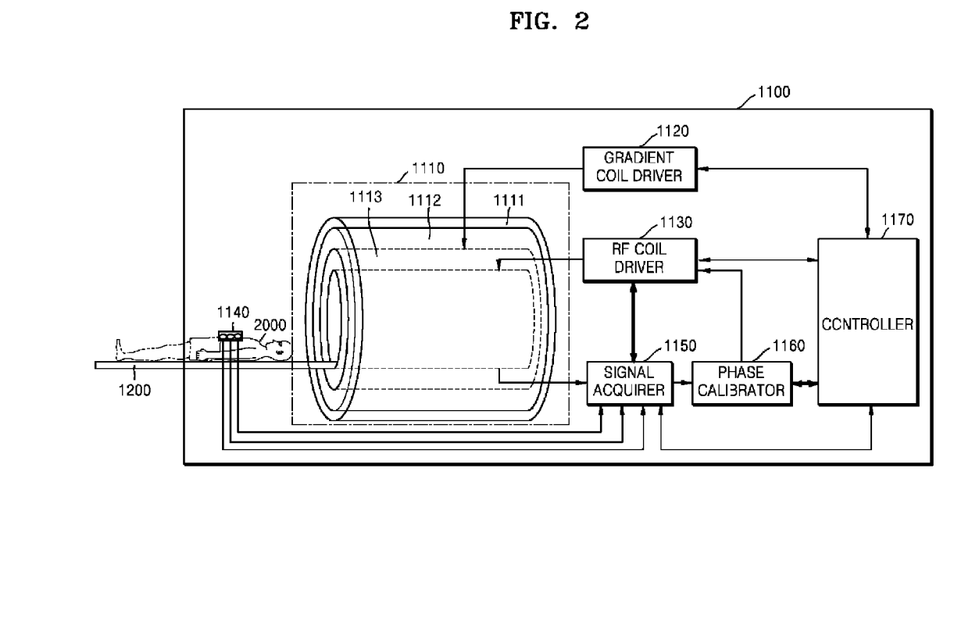
FIG. 2 is a diagram illustrating an example of an MRI apparatus.

FIG. 2 is a diagram illustrating an example of the MRI apparatus 1100 of FIG. 1. Referring to FIG. 2, the MRI apparatus 1100 includes the magnet system 1110, a receiver coil part 1140, a gradient coil driver 1120, a radio frequency (RF) coil driver 1130, a signal acquirer 1150, a phase calibrator 1160, and a controller 1170. The magnet system 1110 includes a main magnet 1111, a gradient coil part 1112, and an RF coil part 1113.

Only elements related to the example are shown in the MRI apparatus 1100. Therefore, besides the elements of FIG. 2, other general-purpose elements may be further included.

In other words, the gradient coil driver 1120, the RF coil driver 1130, the signal acquirer 1150, the phase calibrator 1160, and the controller 1170 of the MRI apparatus 1100 may correspond to one or more processors. A processor may include an array of logic gates, or a combination of a general-purpose microprocessor and a memory storing a program executable by the general-purpose microprocessor. In other words, it will be understood by one of ordinary skill in the art that the processor may include another type of hardware.

The main magnet 1111 forms a static magnetic field in an internal space of the magnet system 1110. A direction of the static magnetic field may be parallel with or perpendicular to a body axis direction of the subject 2000, e.g., a longitudinal direction of the subject 2000. The main magnet 1111 may include a permanent magnet, a resistive magnet, a super conductive magnet, and/or other magnets known to one of ordinary skill in the art. Hereinafter, the main magnet 1111 includes the super conductive magnet forming a horizontal static field parallel with the body axis of the subject 2000. Since the super conductive magnet is used as the main magnet 1111, as shown in FIG. 2, the gradient coil part 1112 and the RF coil part 1113 are disposed on the same central axis. Also, the main magnet 1111, the gradient coil part 1112, and the RF coil part 1113 are sequentially disposed from the outside. An inside of the RF coil part 1113 is empty so that the subject 2000 is positioned therein. The subject 2000 is positioned on the bed 1200, and the bed 1200 is moved into the magnet system 1110 to apply the static magnetic field and an RF pulse to the subject 2000.

The gradient coil part 1112 forms a gradient field around the subject 2000 in three axial directions perpendicular to one another. If an RF signal including a frequency corresponding to a multiple of a Larmor frequency is applied to the subject 2000 around which the static magnetic field is formed, MR signals of tissues including similar characteristics are discharged at the same time, thus making it difficult to know what type of signal comes from which position. The gradient field is used to solve this problem. A spin in a predetermined area of the subject 2000 corresponding to an interest area may be selectively resonated using the gradient field where a distribution of the static magnetic field and the Larmor frequency generated by the static magnetic field linearly vary according to a space.

In more detail, three axes perpendicular to one another respectively refer to a slice axis, a frequency axis, and a phase axis. When three coordinate axes perpendicular to one another in an internal space in which a static field is formed are x, y, and, z, one of the three coordinate axes may be a slice axis. One of the other two axes may be a frequency axis, and the other axis may be a phase axis. In this example, a slice axis may be set in a direction inclined at an angle with respect to the body axis of the subject 2000, i.e., the longitudinal direction of the subject 2000.

The gradient coil part 1112 may form three types of gradient fields in x, y, and z directions of the subject 2000. A gradient field is formed along the body axis of the subject 2000 as a precondition to selectively excite a cross-section perpendicular to the body axis of the subject 2000. That is, a slice selection gradient is applied. A frequency encoding gradient and a phase encoding gradient may be applied to acquire 2-dimensional (2D) space information within a selected plane. The gradient coil part 1112 may include three types of gradient coils to form the respective gradient fields in directions of the slice axis, the frequency axis, and the phase axis.

The gradient coil driver 1120 is connected to the gradient coil part 1112, and outputs, to the gradient coil part 1112, a signal used by the gradient coil part 1112 to form a gradient field. The gradient coil driver 1120 includes gradient driver circuits respectively corresponding to the three types of gradient coils for the slice axis, the frequency axis, and the phase axis. The gradient coil driver 1120 may include a waveform synthesizer (not shown) and a gradient amplifier (not shown).

The RF coil part 1113 includes a transceiver coil that applies RF signals to the subject 2000, and acquires MR signals from the subject 2000. An RF signal refers to a signal applied to the subject 2000 to acquire an MR signal from the subject 2000, and an MR signal refers to a signal generated in response to an RF signal applied to the subject 2000. The RF signal also refers to an RF pulse and an RF pulse sequence, which correspond to a B1 magnetic field.

In this example, the transceiver coil applies the RF signals, and acquires the MR signals, but is not limited thereto. In other words, the RF coil part 1113 may include a coil that only applies the RF signals, or only acquires the MR signals.

The RF signals applied to the subject 2000 excite the spin in the subject 2000. The RF coil part 1113 acquires electromagnetic waves generated when the excited spin in the subject 2000 returns to a stable state. The generated electromagnetic waves are referred to as the MR signals. The RF coil part 1113 transmits, to the signal acquirer 1150, the MR signals acquired by the transceiver coil.

The transceiver coil may be a stripline type coil or a Transverse Electromagnetic Mode (TEM) coil, but is not limited thereto. The transceiver coil may also be a multichannel coil.

A size of the B1 magnetic field applied from the RF coil part 1113 (the transceiver coil) to the subject 2000 is uniform so that the MR image generated by the MRI system 1000 uniformly and dearly shows information of the subject 2000. However, the B1 magnetic field may be affected by an internal structure of the transceiver coil or several surrounding magnetic materials, and thus may become non-uniform. Therefore, shimming of the B1 magnetic field is to be performed to make the non-uniform B1 magnetic field uniform, as discussed below.

The RF coil driver 1130 is connected to the RF coil part 1113, and outputs, to the RF coil part 1113, the RF signals to be applied by the RF coil part 1113 to the subject 2000. The RF coil driver 1130 may include an RF oscillator (not shown), a phase shifter (not shown), a waveform synthesizer (not shown), a modulator (not shown), and an RF amplifier (not shown). The RF oscillator oscillates an RF pulse, the phase shifter shifts a phase of the RF pulse, and the waveform synthesizer forms an appropriate type of an RF pulse sequence. The modulator modulates the RF pulse sequence, and the RF amplifier amplifies RF pulses.

The RF coil driver 1130 determines an operation mode of the RF coil part 1113. For example, the RF coil driver 1130 determines whether the RF coil part 1113 operates in a Tx-Rx mode, a Tx mode, or an Rx mode. In the Tx-Rx mode, the RF coil part 1113 applies the RF signals to the subject 2000, and acquires the MR signals from the subject 2000. In the Tx mode, the RF coil part 1113 applies the RF signals to the subject 2000, and in the Rx mode, the RF coil part 1113 acquires the MR signals from the subject 2000. When the RF coil part 1113 is determined to operate in the Tx-Rx mode or the Rx-mode to acquire the MR signals from the subject 2000, the RF coil driver 11130 transmits, to the signal acquirer 1150, a signal that requests to receive, from the signal acquirer 1150, the MR signals acquired by the RF coil part 1113.

The receiver coil part 1140 includes one or more receiver coils that acquire MR signals from the subject 2000. The receiver coil part 1140 transmits, to the signal acquirer 1150, the MR signals acquired by the receiver coils. As described above, the signal acquirer 1150 also receives the MR signals acquired by the RF coil part 1113. The receiver coils may only receive the MR signals. The receiver coils may be disposed above the subject 2000, but are not limited thereto.

Figure 3:
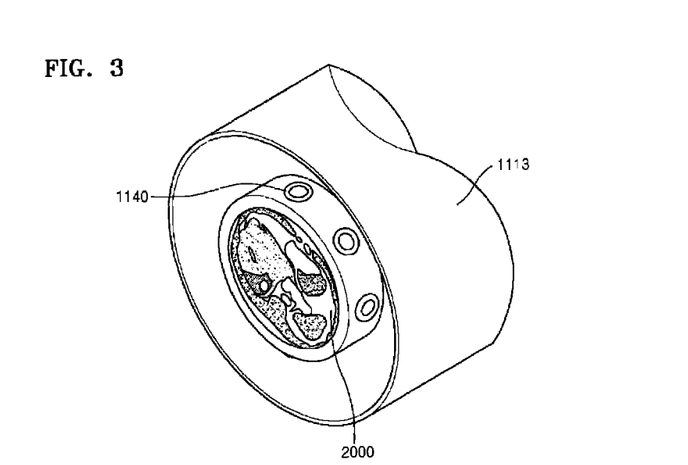
FIG. 3 is a diagram illustrating an example of a position relation between a subject, a transceiver coil of a radio frequency (RF) coil part, and receiver coils of a receiver coil part.

FIG. 3 is a diagram illustrating an example of a position relation between the subject 2000 of FIG. 2, the transceiver coil of the RF coil part 1113 of FIG. 2, and the receiver coils of the receiver coil part 1140 of FIG. 2. FIG. 3 illustrates a cross-section of the subject 2000 and the transceiver coil when the transceiver coil includes a cylindrical shape, and the subject 2000 is positioned inside the transceiver coil.

The receiver coils are disposed in respective predetermined positions above the subject 2000. For example, when the subject 2000 is a patient, and the MRI system 1000 of FIG. 1 acquires an image of an abdomen of the patient, the receiver coils may be disposed above the abdomen of the patient.

The receiver coils include respective circular shapes in FIG. 3, but are not limited thereto. A number of the receiver coils disposed above the subject 2000 is a total of 8 in FIG. 3, but is not limited thereto.

The receiver coils acquire MR signals generated due to RF signals applied by the transceiver coil to the subject 2000, and transmits the MR signals to the signal acquirer 1150 of FIG. 2. The receiver coil part 1140 is used to increase a total number of MR signals that the signal acquirer 1150 may receive. That is, the signal acquirer 1150 may receive a larger number of MR signals when the RF coil part 1113 and the receiver coil part 1140 acquire the MR signals than when only the RF coil part 1113 acquires MR signals.

When the receiver coils are disposed above the subject 2000, a distance between the subject 2000 generating the MR signals and the receiver coils acquiring the MR signals is reduced. Therefore, the signal acquirer 1150 receives the MR signals that are less distorted. That is, if only the transceiver coil acquires MR signals, the acquired MR signals may be distorted due to an empty space between the subject 2000 and the transceiver coil. When the receiver coils also acquire MR signals, the signal acquirer 1150 receives the MR signals acquired by the receiver coils that are less distorted due to the receiver coils being disposed closer in distance to the subject 2000 than the transceiver coil. In other words, the receiver coils are positioned inside the transceiver coil when the MR signals are acquired.

Referring to FIG. 2 again, the signal acquirer 1150 receives MR signals acquired by the RF coil part 1113 and the receiver coil part 1140, and processes the MR signals as digital data or signals. For example, the signal acquirer 1150 may include a preamplifier (not shown), a demodulator (not shown), a low pass filter (LPF), and an analog-to-digital converter (ADC) (not shown). The preamplifier amplifies a received MR signal, and the demodulator demodulates the amplified MR signal. The LPF removes noise from the demodulated MR signal, and the ADC converts the demodulated MR signal (i.e., an analog signal) into a digital signal.

The signal acquirer 1150 may select MR signals acquired by one or more predetermined coils from the MR signals acquired by the RF coil part 1113 and the receiver coil part 1140. For example, the signal acquirer 1150 may include a coil selector (not shown) that selects the predetermined coils from the transceiver coil of the RF coil part 1113 and the receiver coils of the receiver coil part 1140 so that the signal acquirer 1150 may process only the MR signals acquired by the selected predetermined coils as digital data.

The RF coil driver 1130 and the signal acquirer 1150 may be integrated with each other like a transceiver.

The signal acquirer 1150 transmits, to the RF coil driver 1130, information of MR signals acquired by the RF coil part 1113. The signal acquirer 1150 also transmits, to the phase calibrator 1160, information of MR signals acquired by the receiver coil part 1140.

Information of MR signals that are used to shim a B1 magnetic field is complex data including magnitudes and phases of the MR signals. As described above, the signal acquirer 1150 receives MR signals acquired by the RF coil part 1113 and MR signals acquired by the receiver coil part 1140 to receive a larger number of MR signals. However, phase offsets may occur in the MR signals respectively acquired by the receiver coils of the receiver coil part 1140 due to an internal problem of the MRI apparatus 1100. For example, if the receiver coil part 1140 operates as a multichannel coil, phase offsets may occur in the MR signals. If the phase offsets occur in the MR signals, an error may occur in the information of the MR signals that are used to shim the B1 magnetic field. Therefore, the B1 magnetic field may be not accurately shimmed.

Accordingly, the phase calibrator 1160 calibrates (e.g., removes or adjusts) the phase offsets of the MR signals acquired by the receiver coil part 1140. In more detail, the phase calibrator 1160 acquires reference phase values of MR signals, using one or more oil phantoms, and calibrates the phase offsets of the MR signals acquired by the receiver coil part 1140 based on the acquired reference phase values. Hereinafter, a phantom used to acquire reference phase values of a MR signals will be referred to as an oil phantom, but is not limited thereto. That is, an oil phantom may be replaced with any homogeneous phantom including a characteristic of a material that is known, without a limitation. The characteristic of the material refers to a physical or chemical characteristic of the material, such as, for example, T1, T2, a permittivity, a conductivity, and/or other characteristics known to one of ordinary skill in the art, affecting a MR signal.

Figure 4:
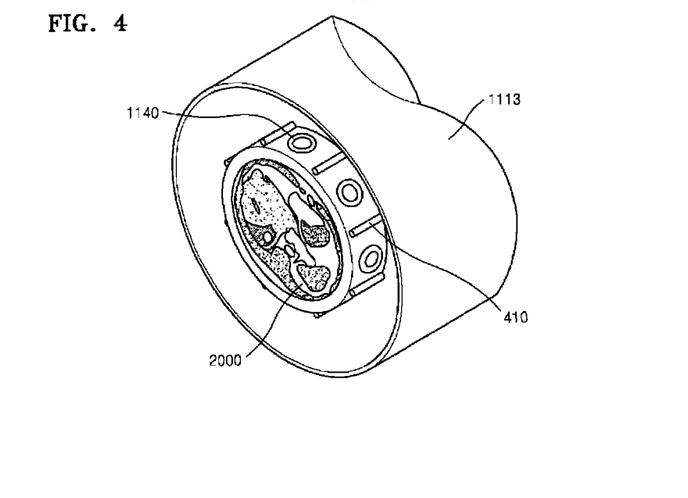
FIG. 4 is a diagram illustrating an example of a position relation between a subject, a transceiver coil of an RF coil part, receiver coils of a receiver coil part, and oil phantoms.

FIG. 4 is a diagram illustrating an example of a position relation between the subject 2000 of FIG. 2, the transceiver coil of the RF coil part 1113 of FIG. 2, the receiver coils of the receiver coil part 1140 of FIG. 2, and oil phantoms 410. FIG. 4 illustrates a cross-section of the subject 2000 and the transceiver coil when the transceiver coil includes a cylindrical shape, and the subject 2000 is positioned inside the transceiver coil.

The oil phantoms 410 are disposed in respective predetermined areas above the subject 2000. For example, when the subject 2000 is a patient, and the MRI system 1000 of FIG. 1 acquires an image indicating an abdomen of the patient, the oil phantoms 410 may be disposed above the abdomen of the patient.

The oil phantoms 410 alternate with the receiver coils in FIG. 4, but are not limited thereto. Also, a number of the oil phantoms 410 is not limited to a number shown in FIG. 4.

The oil phantoms 410 are not limited to being disposed outside the subject 2000. For example, the oil phantoms 410 may be disposed inside the subject 2000, inside the transceiver coil, and/or inside the receiver coils.

Referring to FIG. 2 again, in more detail, the phase calibrator 1160 measures phases of the MR signals acquired by one or more predetermined coils (e.g., the receiver coils), using the oil phantoms, to acquire the reference phase values of the MR signals. The phase calibrator 1160 calibrates phases of the MR signals acquired by the receiver coils based on the acquired reference phase values so that the phases include constant values. The phase calibrator 1160 transmits, to the RF coil driver 1130 and/or the controller 1170, information of the calibrated MR signals acquired by the receiver coils, which include the calibrated phase offsets.

The RF coil driver 1130 generates RF signals to be applied by the transceiver coil of the RF coil part 1113 to the subject 2000 based on MR signals acquired by the transceiver coil and the calibrated MR signals acquired by the receiver coils of the receiver coil part 1140. In more detail, the RF coil driver 1130 estimates (e.g., shims) a characteristic of a magnetic field to be formed by the RF signals based on the MR signals acquired by the transceiver coil, which are transmitted from the signal acquirer 1150, and the calibrated MR signals acquired by the receiver coils, which are transmitted from the phase calibrator 1160. The RF coil driver 1130 calculates parameters of the RF signals based on the estimated characteristic of the magnetic field, and generates the RF signals based on the calculated parameters. Therefore, the RF signals to be applied by the transceiver coil to the subject 2000 may be changed based on results of the calibration of the MR signals acquired by the receiver coils that is performed by the phase calibrator 1160.

The characteristic of the magnetic field to be formed by the RF signals to be applied by the RF coil part 1113 to the subject 2000 is uniformly formed due to a completion of shimming of the magnetic field. That is, the RF signals generated by the RF coil driver 1130 and applied by the RF coil part 1113 to the subject 2000 form the magnetic field that is completely shimmed. The parameters of the RF signals may include, for example, amplitudes, phases, frequencies, and/or other parameters known to one of ordinary skill in the art.

The controller 1170 controls elements of the MRI apparatus 1100, namely, the gradient coil driver 1120, the RF coil driver 1130, the signal acquirer 1150, and the phase calibrator 1160. The controller 1170 receives a control signal from the operating console 1500 of FIG. 1 to control the MRI apparatus 1100.

Figure 5:
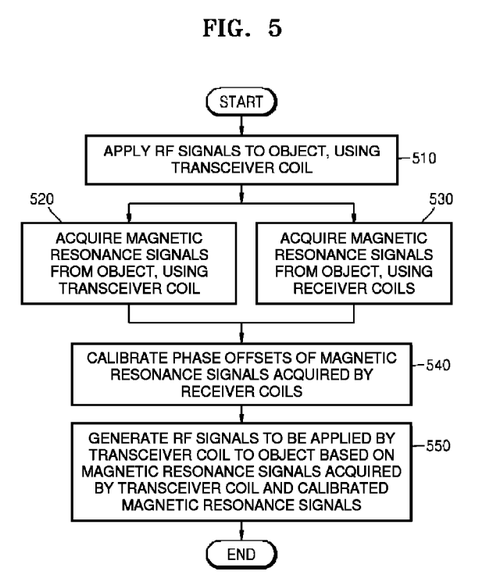
FIG. 5 is a flowchart illustrating an example of a method of shimming a magnetic field.

FIG. 5 is a flowchart illustrating an example of a method of shimming a magnetic field. Referring to FIG. 5, the method includes operations processed in a time series in the MRI system 1000 or the MRI apparatus 1100 shown in FIGS. 1 and 2. Therefore, although the above descriptions of the MRI system 1000 or the MRI apparatus 1100 are omitted hereafter, the descriptions may be applied to the method of FIG. 5.

In operation 510, the RF coil part 1113 of FIG. 2 applies RF signals to an object, using a transceiver coil. The transceiver coil may be a multi-channel coil.

In operation 520, the RF coil part 1113 acquires magnetic resonance signals from the object, using the transceiver coil.

In operation 530, the receiver coil part 1140 of FIG. 2 acquires magnetic resonance signals from the object, using one or more receiver coils. The receiver coils may be multi-channel coils. Operations 520 and 530 may be simultaneously performed.

In operation 540, the phase calibrator 1160 of FIG. 2 calibrates phase offsets of the magnetic resonance signals acquired by the receiver coils. In more detail, the phase calibrator 1160 acquires reference phase values of magnetic resonance signals, using one or more oil phantoms, and calibrates the phase offsets of the magnetic resonance signals based on the acquired reference phase values.

In operation 550, the RF coil driver 1130 of FIG. 2 generates RF signals to be applied by the transceive coil to the object based on the magnetic resonance signals acquired by the transceiver coil and the calibrated magnetic resonance signals. The RF signals to be applied by the transceiver coil to the object may be changed based on results of the calibration of the magnetic resonance signals acquired by the receiver coils that is performed by the phase calibrator 1160 in operation 540.

Figure 6:
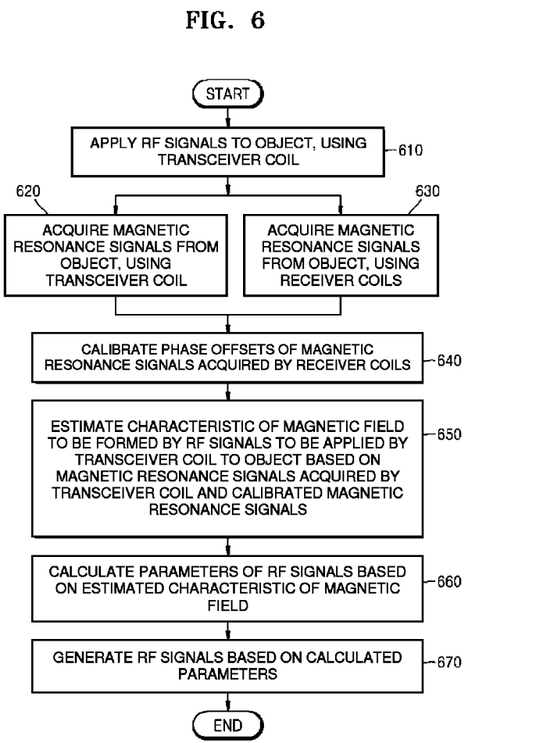
FIG. 6 is a flowchart illustrating another example of a method of shimming a magnetic field.

FIG. 6 is a flowchart illustrating another example of a method of shimming a magnetic field. Referring to FIG. 6, the method includes operations processed in a time series in the MRI system 1000 or the MRI apparatus 1100 shown in FIGS. 1 and 2. Therefore, although the above descriptions of the MRI system 1000 or the MRI apparatus 1100 are omitted hereafter, the descriptions may be applied to the method of FIG. 6.

In operation 610, the RF coil part 1113 of FIG. 2 applies RF signals to an object, using a transceiver coil. The transceiver coil may be a multi-channel coil.

In operation 620, the RF coil part 1113 acquires magnetic resonance signals from the object, using the transceiver coil.

In operation 630, the receiver coil part 1140 of FIG. 2 acquires magnetic resonance signals from the object, using one or more receiver coils. The receiver coils may be multi-channel coils. Operations 620 and 630 may be simultaneously performed.

In operation 640, the phase calibrator 1160 of FIG. 2 calibrates phase offsets of the magnetic resonance signals acquired by the receiver coils. In more detail, the phase calibrator 1160 acquires reference phase values of magnetic resonance signals, using one or more oil phantoms, and calibrates the phase offsets of the magnetic resonance signals based on the acquired reference phase values. The phase calibrator 1160 may transmit the calibrated phase offsets to the controller 1170.

In operation 650, the RF coil driver 1130 of FIG. 2 estimates a characteristic of a magnetic field to be formed by RF signals to be applied by the transceiver coil to the object based on the magnetic resonance signals acquired by the transceiver coil and the calibrated magnetic resonance signals. The magnetic field to be formed by the RF signals refers to a shimmed magnetic field.

In operation 660, the RF coil driver 1130 calculates parameters of the RF signals to be applied by the transceiver coil to the object based on the estimated characteristic of the magnetic field. The parameters of the RF signals refer to amplitudes, phases, frequencies, and/or other parameters known to one of ordinary skill in the art.

In operation 670, the RF coil driver 1130 generates the RF signals to be applied by the transceiver coil to the object based on the calculated parameters.

As described above, the MRI apparatus 1100 additionally uses the receiver coils to receive additional MR signals, thereby acquiring a high-quality shimming result and reducing a time of shimming and acquiring an image. Also, the MRI apparatus 1100 uses an existing multi-channel transmission system without adding an RF transceive channel coil, thereby acquiring a high-quality MR image without additional cost.

The various elements and methods described above may be implemented using one or more hardware components, one or more software components, or a combination of one or more hardware components and one or more software components.

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may include various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions that control a processing device to implement a software component may include a computer program, a piece of code, an instruction, or some combination thereof, that independently or collectively instructs or configures the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments that implement the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of shimming a magnetic field, the method comprising:
   applying radio frequency (RF) signals to an object, using a transceiver coil;
   acquiring reference phases of magnetic resonance (MR) signals using a set of phantoms;
   calibrating phase offsets of the MR signals acquired from the object through a set of receiver coils positioned around a concentric ring within the transceiver coil based on the reference phases; and
   generating RF signals to be applied through the transceiver coil based on MR signals acquired from the object through the transceiver coil and the calibrated MR signals,
   wherein the phantoms are positioned around the concentric ring and alternate with the receiver coils.

2. The method of claim 1, wherein a phantom of the set of phantoms is disposed above the object.

3. The method of claim 1, wherein the RF signals to be applied through the transceiver coil are changed based on the calibrated MR signals.

4. The method of claim 1, wherein a receiver coil of the set of receiver coils is disposed above the object.

5. The method of claim 1, wherein the transceiver coil comprises a multi-channel coil.

6. The method of claim 1, wherein the generating comprises:
   estimating a characteristic of a magnetic field to be formed by the RF signals to be applied through the transceiver coil based on the MR signals acquired through the transceiver coil and the calibrated MR signals;
   calculating parameters of the RF signals to be applied through the transceiver coil based on the characteristic; and
   generating the RF signals to be applied through the transceiver coil based on the parameters.

7. The method of claim 1, wherein the concentric ring having the set of receiver coils is disposed closer in distance to the object than the transceiver coil.

8. A non-transitory computer-readable storage medium storing a program comprising instructions to cause a computer to perform the method of claim 1.

9. The method of claim 1, further comprising:
   selecting a subset of coils from among the transceiver coil and the set of receiver coils; and
   processing MR signals acquired by the selected subset while excluding MR signals acquired by coils outside the selected subset from processing.

10. An apparatus configured to shim a magnetic field, the apparatus comprising:
    a transceiver coil configured to apply radio frequency (RF) signals to an object, and acquire magnetic resonance (MR) signals from the object;
    a set of receiver coils positioned around a concentric ring within the transceiver coil and configured to acquire MR signals from the object;
    a phase calibrator configured to
      acquire reference phases of MR signals using a set of phantoms, wherein the phantoms are positioned around the concentric ring and alternate with the receiver coils, and
      calibrate phase offsets of the MR signals acquired through the set of receiver coils based on the reference phases; and
    an RF coil driver configured to generate RF signals to be applied through the transceiver coil based on the MR signals acquired through the transceiver coil and the calibrated MR signals.

11. The apparatus of claim 4, wherein a phantom of the set of phantoms is disposed above the object.

12. The apparatus of claim 10, wherein the RF signals to be applied through the transceiver coil are changed based on the calibrated MR signals.

13. The apparatus of claim 10, wherein a receiver coil of the set of receiver coils is disposed above the object.

14. The apparatus of claim 10, wherein the transceiver coil comprises a multi-channel coil.

15. The apparatus of claim 10, wherein the RF coil driver is further configured to:
    estimate a characteristic of a magnetic field to be formed by the RF signals to be applied through the transceiver coil based on the MR signals acquired through the transceiver coil and the calibrated MR signals;
    calculate parameters of the RF signals to be applied through the transceiver coil based on the characteristic; and
    generate the RF signals to be applied through the transceiver coil based on the parameters.

16. The apparatus of claim 10, wherein the concentric ring having the set of receiver coils is disposed closer in distance to the object than the transceiver coil.

* * * * *